US010845390B2

(12) United States Patent
Das et al.

(10) Patent No.: US 10,845,390 B2
(45) Date of Patent: Nov. 24, 2020

(54) SYSTEM FOR MEASURING THE VOLTAGE OF A BUSBAR

(71) Applicant: EATON INDUSTRIES (NETHERLANDS) B.V., Hengelo (NL)

(72) Inventors: Amritendu Das, Maligram (IN); Arend Lammers, Hengelo (NL)

(73) Assignee: EATON INDUSTRIES (NETHERLANDS) B.V., Hengelo (NL)

( * ) Notice: Subject to any disclaimer, the term of this patent is extended or adjusted under 35 U.S.C. 154(b) by 196 days.

(21) Appl. No.: 15/745,718

(22) PCT Filed: Jun. 28, 2016

(86) PCT No.: PCT/EP2016/065070
§ 371 (c)(1),
(2) Date: Jan. 18, 2018

(87) PCT Pub. No.: WO2017/012837
PCT Pub. Date: Jan. 26, 2017

(65) Prior Publication Data
US 2018/0210013 A1      Jul. 26, 2018

(30) Foreign Application Priority Data

Jul. 20, 2015   (IN) ............................ 2182/DEL/2015
Oct. 21, 2015   (GB) .................................. 1518686.9

(51) Int. Cl.
*G01R 15/14*         (2006.01)
*G01R 15/16*         (2006.01)
(Continued)

(52) U.S. Cl.
CPC .......... *G01R 15/06* (2013.01); *G01R 19/0007* (2013.01); *G01R 19/2503* (2013.01); *G01R 19/32* (2013.01)

(58) Field of Classification Search
CPC ........ G01R 15/06; G01R 15/14; G01R 15/16; G01R 19/00; G01R 19/0007; G01R 19/2503; G01R 19/32; G01R 19/25; G01R 27/26
See application file for complete search history.

(56) References Cited

U.S. PATENT DOCUMENTS 3,942,099 A  *  3/1976  Freygang ............... G01R 15/14
                                                        323/358
4,052,668 A  *  10/1977  Schmitt .................. G01R 15/16
                                                        324/126

(Continued)

FOREIGN PATENT DOCUMENTS

CN       102053191 B      9/2012
EP       2508898 A1       10/2012
(Continued)

OTHER PUBLICATIONS

Sixten Bergman et al: "New Reference Measurement System for Calibration of VLF High Voltage", IEEE Transactions on Instrumentation and Measurement, IEEE Service Center, Piscataway, NJ, US, vol. 60, No. 7, Jul. 1, 2011 (Jul. 1, 2011), pp. 2422-2426, XP011326422.

*Primary Examiner* — Neel D Shah
(74) *Attorney, Agent, or Firm* — Leydig, Voit & Mayer, Ltd.

(57) ABSTRACT

A combination of a conductor, such as a busbar, and a device for measuring the AC voltage in the conductor, which device includes: an insulation layer arranged on the conductor; a capacitor plate arranged on the insulation layer and configured to position the capacitor plate at a fixed distance from the conductor to form a first capacitor; a second capacitor arranged electrically between the capacitor plate and ground (Continued)

to provide a capacitive voltage divider with the first capacitor; and a voltage measurer for measuring the voltage at the capacitor plate, the voltage measurer including a frequency measurer for measuring the frequency of the voltage in the conductor and an AC voltage calculator for calculating the AC voltage in the conductor based on the capacities of the first and second capacitors, the measured voltage, and the measured frequency.

6 Claims, 1 Drawing Sheet

(51) Int. Cl.
*G01R 19/00* (2006.01)
*G01R 19/25* (2006.01)
*G01R 27/26* (2006.01)
*G01R 15/06* (2006.01)
*G01R 19/32* (2006.01)

(56) References Cited

U.S. PATENT DOCUMENTS

| | | | | |
|---|---|---|---|---|
| 6,104,181 | A | * | 8/2000 | Muller ............... G01R 15/26 324/126 |
| 6,470,283 | B1 | * | 10/2002 | Edel ................ G01R 19/2513 324/72.5 |
| 2002/0180459 | A1 | | 12/2002 | Skendzic et al. |
| 2002/0190705 | A1 | * | 12/2002 | Skendzic ............ G01R 15/142 324/127 |
| 2006/0170432 | A1 | * | 8/2006 | Adolfsson ............ G01R 15/16 324/658 |
| 2009/0254291 | A1 | | 10/2009 | Benmouyal |

FOREIGN PATENT DOCUMENTS

EP 2993480 A1 3/2016
GB 1471570 A 4/1977

* cited by examiner

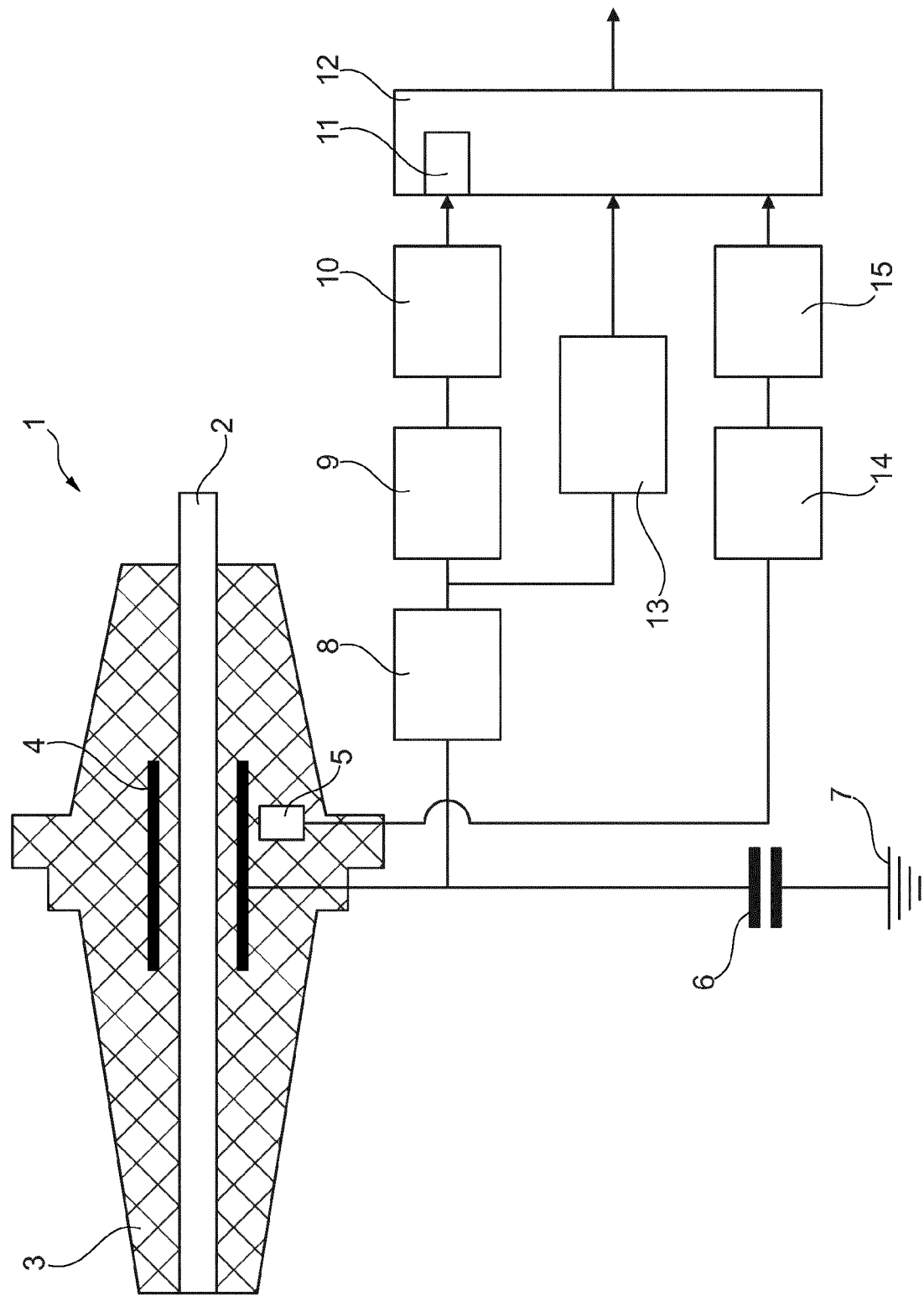

SYSTEM FOR MEASURING THE VOLTAGE OF A BUSBAR

CROSS-REFERENCE TO PRIOR APPLICATIONS

This application is a U.S. National Phase application under 35 U.S.C. § 371 of International Application No. PCT/EP2016/065070, filed on Jun. 28, 2016, and claims benefit to Indian Patent Application No. 2182/DEL/2015, filed on Jul. 20, 2015, and British Patent Application No. 1518686.9, filed on Oct. 21, 2015. The International Application was published in English on Jan. 26, 2017 as WO 2017/012837 under PCT Article 21(2).

FIELD

The invention relates to a combination of a conductor, such as a busbar, and a device for measuring the AC voltage in the conductor, which device comprises:
  an insulation layer arranged on the conductor;
  a capacitor plate arranged on the insulation layer to position the capacitor plate at a fixed distance from the conductor to form a first capacitor;
  a second capacitor arranged electrically between the capacitor plate and ground to provide a capacitive voltage divider with the first capacitor; and
  a voltage measurer for measuring the voltage at the capacitor plate.

BACKGROUND

Such a combination is for example known from U.S. Pat. No. 5,017,859. Capacitive voltage dividers are known to reduce the voltage of the conductor to a level, which is more suitable to be measured with conventional measurement equipment. The use of capacitors allows one to measure the voltage without any leakage of current.

A resistive voltage divider could also be used for measuring the voltage of a conductor, but with high voltages, the components become considerably large and current will leak via the resistors.

The use of a capacitive voltage divider allows one to use smaller components, as no current will flow through the capacitors. However, the capacitors have an impedance which is dependent on the frequency of the voltage to be measured. As long as the frequency is virtually constant, the voltage in the conductor can be measured accurately. However, if the frequency varies, the accuracy of the measurements will vary.

Furthermore, with the combination according to U.S. Pat. No. 5,017,859, the distance of the capacitor plate to the conductor could vary due to manufacturing tolerances or due to heating of the combination, which causes the insulation layer to expand. As a result the capacity of the first capacitor will change having an adverse effect on the voltage measurement.

SUMMARY

In an embodiment, the present invention provides a combination comprising: a conductor, and a device for measuring the AC voltage in the conductor, the device comprising: an insulation layer arranged on the conductor; a capacitor plate arranged on the insulation layer and configured to position the capacitor plate at a fixed distance from the conductor to form a first capacitor; a second capacitor arranged electrically between the capacitor plate and ground to provide a capacitive voltage divider with the first capacitor; and a voltage measurer configured to measure the voltage at the capacitor plate, the voltage measurer comprising a frequency measurer configured to measure the frequency of the voltage in the conductor and an AC voltage calculator configured to calculate the AC voltage in the conductor based on the capacities of the first and second capacitors, the measured voltage, and the measured frequency.

BRIEF DESCRIPTION OF THE DRAWINGS

The present invention will be described in even greater detail below based on the exemplary FIGURES. The invention is not limited to the exemplary embodiments. Other features and advantages of various embodiments of the present invention will become apparent by reading the following detailed description with reference to the attached drawings which illustrate the following:

FIG. 1 shows a schematic view of an embodiment of the combination according to the invention.

DETAILED DESCRIPTION

The present invention provides a combination, which is characterized by:
  a frequency measurer for measuring the frequency of the voltage in the conductor; and
  an AC voltage calculator for calculating the AC voltage in the conductor based on the capacities of the first and second capacitors, the measured voltage and the measured frequency.

Because the frequency of the voltage in the conductor is also measured, one can take into account the changes in the capacitive voltage divider due to any frequency changes.

The AC voltage calculator for calculating the AC voltage in the conductor will first determine, based on the known capacity of the first and second capacitors and the measured frequency, what the capacitive reactance of each capacitor is. Similar equations can be used for the capacitive reactance as for resistors. So, with the measured voltage at the capacitor plate and the ratio between both capacitive reactances of the two capacitors, one can accurately calculate the AC voltage in the conductor.

In a preferred embodiment of the combination according to the invention the AC voltage calculator for calculating the AC voltage in the conductor comprises a microcontroller with an analog to digital converter input connected via a low pass filter, precision rectifier to the capacitor plate.

Calculations can be quickly and accurately done by a microcontroller. However, the AC voltage needs to be rectified, such that the voltage is only of a changing positive value, which can then be fed to low pass filter and then to the analog to digital converter for further processing by the microcontroller.

Another preferred embodiment of the combination according to the invention, further comprises a temperature sensor for measuring the temperature of the insulation layer and wherein the AC voltage calculator for calculating the AC voltage in the conductor takes into account the measured temperature.

When the temperature of the insulation layer changes, the insulation layer will typically expand or compress, such that the distance of the capacitor plate to the conductor will change. Especially in high voltage applications, in which the insulation layer will typically be an epoxy resin, temperatures can rise substantially and expansion of the epoxy resin will be considerable. This will cause the capacity of the first capacitor to reduce when the temperature rises.

In order to take the changes in the capacity of the first capacitor into account, the temperature is measured and based on an equation or based on calibration data, the changes in the capacity of the first capacitor will be taken into account based on the measured temperature.

Yet another embodiment of the combination according to the invention, further comprises a storage device for storing calibration data and wherein the AC voltage measurer for calculating the AC voltage in the conductor takes into account the calibration data out of the storage device.

Although the manufacturing process could be very accurate, there will still be some small differences between similar combinations. In order to further increase the accuracy of the calculation of the AC voltage in the conductor, a combination can be tested with known voltages directly after manufacturing. The resulting data can be stored in the storing device, such that this calibration data can be taken into account during the calculation of the AC voltage in the conductor.

In a preferred embodiment of the combination according to the invention, the combination is a high voltage bushing.

A bushing 1 is shown in FIG. 1 having a conductor 2 embedded in an epoxy resin 3. A capacitor plate 4 is concentrically around the conductor 2 with the epoxy resin 3 serving as insulation layer in between. Furthermore, a temperature sensor 5 is embedded near capacitor plate 4 in the epoxy resin 3 for measuring the temperature of the epoxy resin 3.

The conductor 2 and the capacitor plate 4 embody a first capacitor, which is connected to a second capacitor 6, which in turn is connected to ground 7. The first capacitor 2, 4 and the second capacitor 6 provide a capacitive voltage divider.

The voltage of the capacitor plate 4 is first fed to a buffer and low pass filter 8 to protect the electronics behind the buffer and low pass filter 8, as well to filter any high frequency noise.

The voltage of the capacitor plate 4 is then fed via a precision full wave rectifier 9 and low pass filter 10 to an analog to digital converter 11 of a microcontroller 12 for converting to a digital value of the measured voltage.

The voltage of the capacitor plate 4 is also fed to a zero crossing detector type voltage converter 13, which feeds to the microcontroller 12 for frequency measurement.

Also the signal of the temperature sensor 5 is fed via a low pass filter 14 and an amplifier 15 to the microcontroller 12 for measuring and taking into account the epoxy inner temperature.

Taking into account the epoxy temperature, the microcontroller 12 can calculate based on the digital value of the measured voltage on the capacitor plate 4, the measured frequency and the known capacities of the first capacitor 2, 4 and the second capacitor 6, what the real voltage in the conductor 2 is.

Using the temperature measurements of the temperature sensor 5, the microcontroller 12 can calculate the change in the first capacitor 2, 4 capacity due to the expansion or compression of the epoxy resin for any change in the epoxy inner temperature using a software algorithm and the stored pre-test data in the microcontroller. The microcontroller 12 adjusts the measured voltage as per the new calculated first capacitor 2, 4 capacity using the software algorithm for accurate voltage measurement.

calculates the change in the first capacitor 2, 4 capacity due to the expansion or compression of the epoxy resin for any change in the epoxy inner temperature using a software algorithm and the stored pre-test data in the microcontroller. The microcontroller 12 adjusts the measured voltage as per the new calculated first capacitor 2, 4 capacity using the software algorithm for accurate voltage measurement.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:
1. A system, comprising:
   a conductor, and
   a device for measuring the AC voltage in the conductor, the device comprising:
      an insulation layer arranged on the conductor;
      a capacitor plate arranged in the insulation layer to position the capacitor plate at a fixed distance from the conductor to form a first capacitor;
      a second capacitor arranged electrically between the capacitor plate and ground to provide a capacitive voltage divider with the first capacitor;
      a first low pass filter connected to the capacitor plate;
      a precision full wave rectifier connected in series with the first low pass filter;
      a zero crossing detector type voltage converter connected in parallel with the precision full wave rectifier; and
      a microcontroller having an analog-to-digital converter input connected to the capacitor plate via the first low pass filter and the precision full wave rectifier, the microcontroller receiving an output of the zero crossing detector type voltage converter,
   wherein the microcontroller is configured to measure a voltage at the capacitor plate as a measured voltage and to measure a frequency of the measured voltage as a measured frequency, the microcontroller being further configured to calculate an AC voltage in the conductor based on capacities of the first and second capacitors, the measured voltage, and the measured frequency.

2. The system according to claim 1, further comprising a temperature sensor configured to measure the temperature of the insulation layer as a measured temperature,
  wherein the microcontroller is configured to calculate the AC voltage in the conductor based on the measured temperature.

3. The system according to claim 1, further comprising a storage device configured to store calibration data,
  wherein the microcontroller is configured to calculate the AC voltage in the conductor based on the calibration data.

4. The system according to claim 1, wherein the combination comprises a high voltage bushing.

5. The system according to claim 2, wherein the microcontroller is configured to use the measured frequency and the measured temperature in the insulation layer at each voltage calculation.

6. The system according to claim 1, wherein the conductor comprises a busbar.

* * * * *